(12) United States Patent
Okkoso

(10) Patent No.: US 10,531,588 B2
(45) Date of Patent: Jan. 7, 2020

(54) INFORMATION PROCESSING APPARATUS

(71) Applicant: FUJITSU LIMITED, Kawasaki-shi, Kanagawa (JP)

(72) Inventor: Tomoya Okkoso, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/946,746

(22) Filed: Apr. 6, 2018

(65) Prior Publication Data

US 2018/0310428 A1  Oct. 25, 2018

(30) Foreign Application Priority Data

Apr. 19, 2017  (JP) ................................ 2017-082985

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |
| *H05K 7/20* | (2006.01) |

(52) U.S. Cl.
CPC ......... *H05K 7/1487* (2013.01); *H05K 7/1489* (2013.01); *H05K 7/1492* (2013.01); *H05K 7/20727* (2013.01)

(58) Field of Classification Search
CPC .. H05K 7/1487; H05K 7/1489; H05K 7/1492; H05K 7/20727; G06F 1/1656; G06F 1/1658; G06F 1/187; G06F 1/183; G06F 1/18
USPC ......... 361/724–727, 679.33–679.39
See application file for complete search history.

(56) References Cited

U.S. PATENT DOCUMENTS

| | | | | |
|---|---|---|---|---|
| 8,427,823 B2 * | 4/2013 | Yamada | ............... | G11B 33/128 312/223.1 |
| 9,030,827 B2 * | 5/2015 | Jau | ............ | G06F 1/16 211/49.1 |
| 9,070,419 B1 * | 6/2015 | Zhu | ........ | H05K 7/1491 |
| 9,258,916 B2 * | 2/2016 | Lu | ........... | H04Q 1/021 |
| 9,265,173 B1 * | 2/2016 | Jhang | ................... | G11B 33/128 |
| 9,699,942 B1 * | 7/2017 | Fu | ........ | H05K 7/20727 |
| 9,763,352 B2 * | 9/2017 | Jau | ........ | G11B 33/128 |
| 2002/0181197 A1 * | 12/2002 | Huang | ................. | G11B 33/128 361/679.39 |
| 2007/0047194 A1 * | 3/2007 | Tsai | ........ | G06F 1/184 361/679.32 |

(Continued)

FOREIGN PATENT DOCUMENTS

| | | |
|---|---|---|
| JP | 63-73990 U | 5/1988 |
| JP | 05-50778 U | 7/1993 |
| JP | 2015-115536 | 6/2015 |

*Primary Examiner* — Anthony M Haughton
(74) *Attorney, Agent, or Firm* — Fujitsu Patent Center

(57) ABSTRACT

An information processing apparatus includes a case body, a container that has a first holder that accommodates a first electronic part and a pulling-out space into which the first electronic part is pulled out from the first holder, and that is accommodated in the case body, and a second holder that accommodates a second electronic part, that is coupled to the container via a rotation shaft, and that is shifted between an accommodated state in which the second holder is accommodated in the pulling-out space and a developed state in which the second holder is outside the pulling-out space in accordance with rotation with respect to the container.

19 Claims, 9 Drawing Sheets

(56) References Cited

U.S. PATENT DOCUMENTS

2011/0249392 A1* 10/2011 Kadri .................... G06F 1/187
                                                    361/679.37
2013/0265725 A1* 10/2013 Harvilchuck ........... G06F 1/181
                                                    361/720

* cited by examiner

INFORMATION PROCESSING APPARATUS

CROSS-REFERENCE TO RELATED APPLICATION

This application is based upon and claims the benefit of priority of the prior Japanese Patent Application No. 2017-82985, filed on Apr. 19, 2017, the entire contents of which are incorporated herein by reference.

FIELD

The embodiment discussed herein is related to an information processing apparatus.

BACKGROUND

There is a container that is accommodated in an information processing apparatus, such as a server. A plurality of electronic parts are accommodated in an exchangeable manner in this type of container.

Incidentally, there is an information processing apparatus in which electronic parts can be replaced in a state in which the information processing apparatus is activated, that is, an information processing apparatus for which active maintenance can be performed, for example. In this information processing apparatus, a plurality of electronic parts are respectively pulled out from the container to the outside, for example. This enables the respective electronic parts to be replaced independently from the container.

However, since the electronic parts are pulled out from the container to the outside in the information processing apparatus as described above, it is preferable to prepare a space for allowing the electronic parts to be pulled out outside the container. Meanwhile, there is a possibility that the size of the container increases if the space for allowing the electronic parts to be pulled out is formed inside the container.

The following is a reference document.
[Document 1] Japanese Laid-open Patent Publication No. 2015-115536.

SUMMARY

According to an aspect of the invention, an information processing apparatus includes a case body, a container that has a first holder that accommodates a first electronic part and a pulling-out space into which the first electronic part is pulled out from the first holder, and that is accommodated in the case body, and a second holder that accommodates a second electronic part, that is coupled to the container via a rotation shaft, and that is shifted between an accommodated state in which the second holder is accommodated in the pulling-out space and a developed state in which the second holder is outside the pulling-out space in accordance with rotation with respect to the container.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment of the technique disclosed in the present application will be described.

(Information Processing Apparatus)

Figure 1:
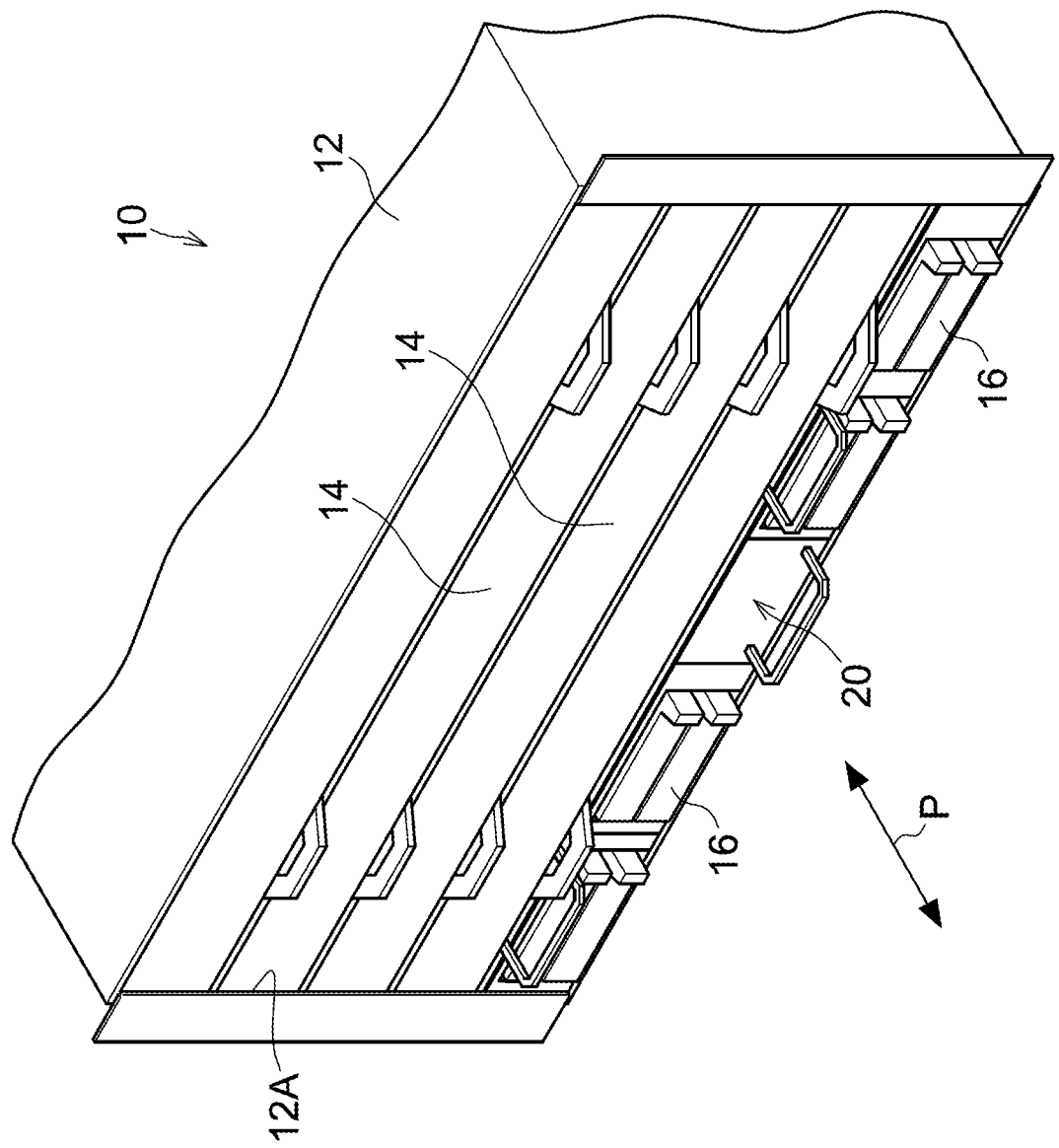
FIG. 1 is a perspective view illustrating an information processing apparatus according to an embodiment.

As illustrated in FIG. 1, an information processing apparatus 10 according to an embodiment is, for example, a server or the like. This information processing apparatus 10 includes a case body 12 and a container 20.

(Case Body)

The case body 12 is formed into a box shape. In addition, an accommodation port 12A is formed on the front surface side of the case body 12. The container 20 is accommodated so as to be able to be pulled out at the center of a lower portion of the case body 12. Note that a plurality of electronic units 14 are accommodated at a middle portion and an upper portion of the case body 12. In addition, electronic units 16 are accommodated on both sides of the container 20 at the lower portion of the case body 12.

(Container)

Figure 2:
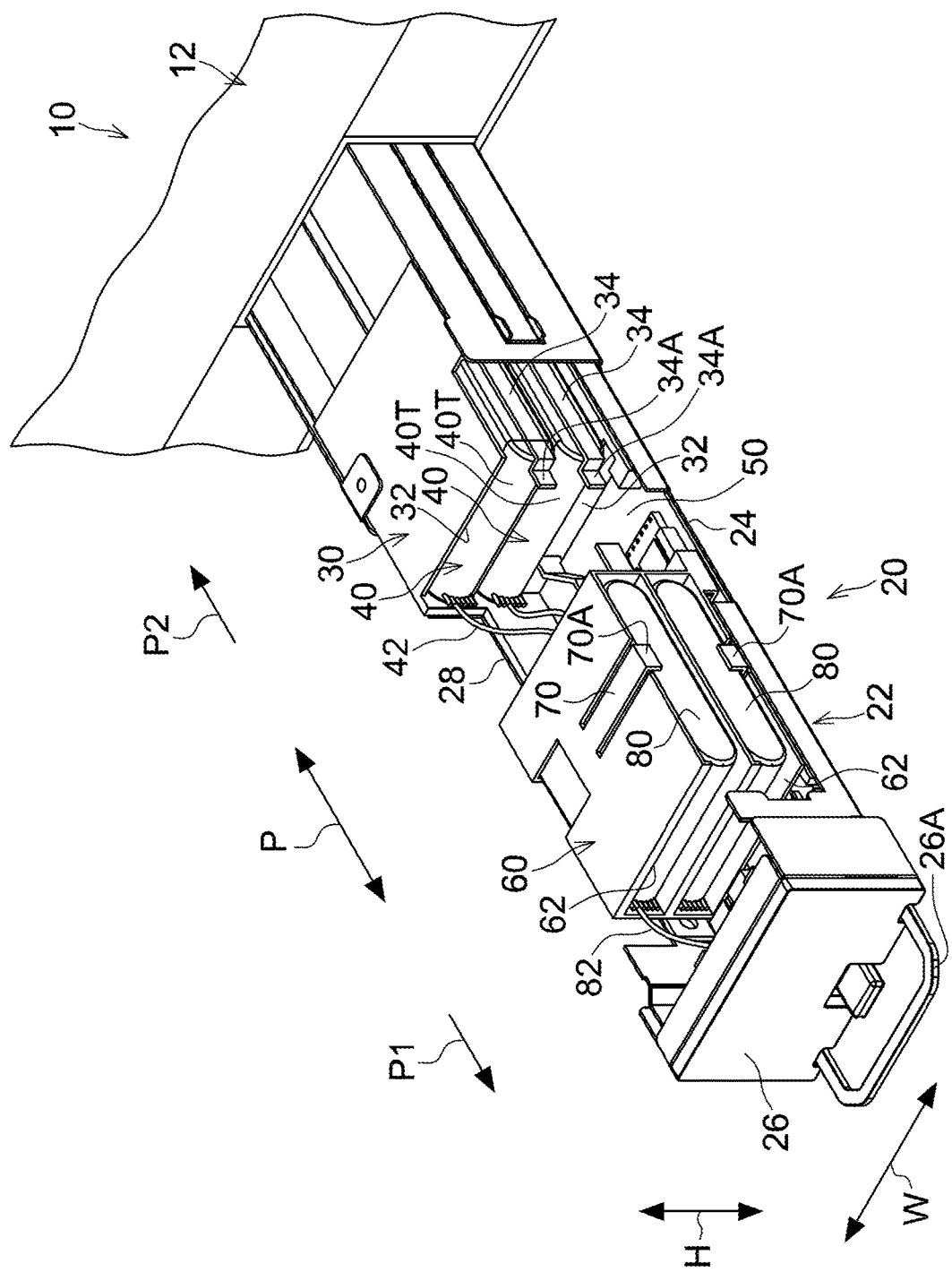
FIG. 2 is a perspective view illustrating a state in which a container has been pulled out from a case body of the information processing apparatus illustrated in FIG. 1.

As illustrated in FIG. 2, the container 20 is pulled out from the accommodation port 12A of the case body 12. Note that the arrow P appropriately illustrated in the respective drawings represents an accommodation direction (pulling-out direction) of the container 20 with respect to the case body 12. In addition, the arrow P1 represents the closer side in the accommodation direction of the container 20 with respect to the case body 12, and the arrow P2 represents the further side in the accommodation direction of the container 20 with respect to the case body 12. Further, the arrow W represents a width direction of the container 20 (a first holder 30 and a second holder 60), and the arrow H represents a height direction of the container 20. In addition, the closer side and the further side in the following description mean the closer side in the accommodation direction and the further side in the accommodation direction of the container 20, respectively.

The container 20 has a frame 22, a first holder 30, and a second holder 60. The frame 22 is arranged such that an accommodation direction of the container 20 corresponds to a longitudinal direction thereof. In addition, the frame 22 is formed into a box shape with an upper side opened. This frame 22 has a base panel portion 24, a front panel portion 26, and a pair of side panel portions 28.

The base panel portion 24 is formed into a rectangular shape such that the accommodation direction (pulling-out direction) of the container 20 corresponds to the longitudinal direction thereof. The base panel portion 24 forms a floor of the container 20. In addition, a front panel portion 26 is provided at an end portion of the base panel portion 24 on the closer side.

The front panel portion 26 is provided along the end portion of the base panel portion 24 on the closer side and is made to extend in a wall shape from the end portion toward the upper side. A grip portion 26A that an operator grips is provided in a front surface of the front panel portion 26. The grip portion 26A can be appropriately omitted.

In addition, side panel portions 28 are respectively provided at end portions of the base panel portion 24 on both sides in a width direction (the direction of the arrow W). The pair of side panel portions 28 are provided along the end portions of the base panel portion 24 on both sides in the width direction and are made to extend in wall shapes from the end portions toward the upper side.

(First Holder)

Figure 3:
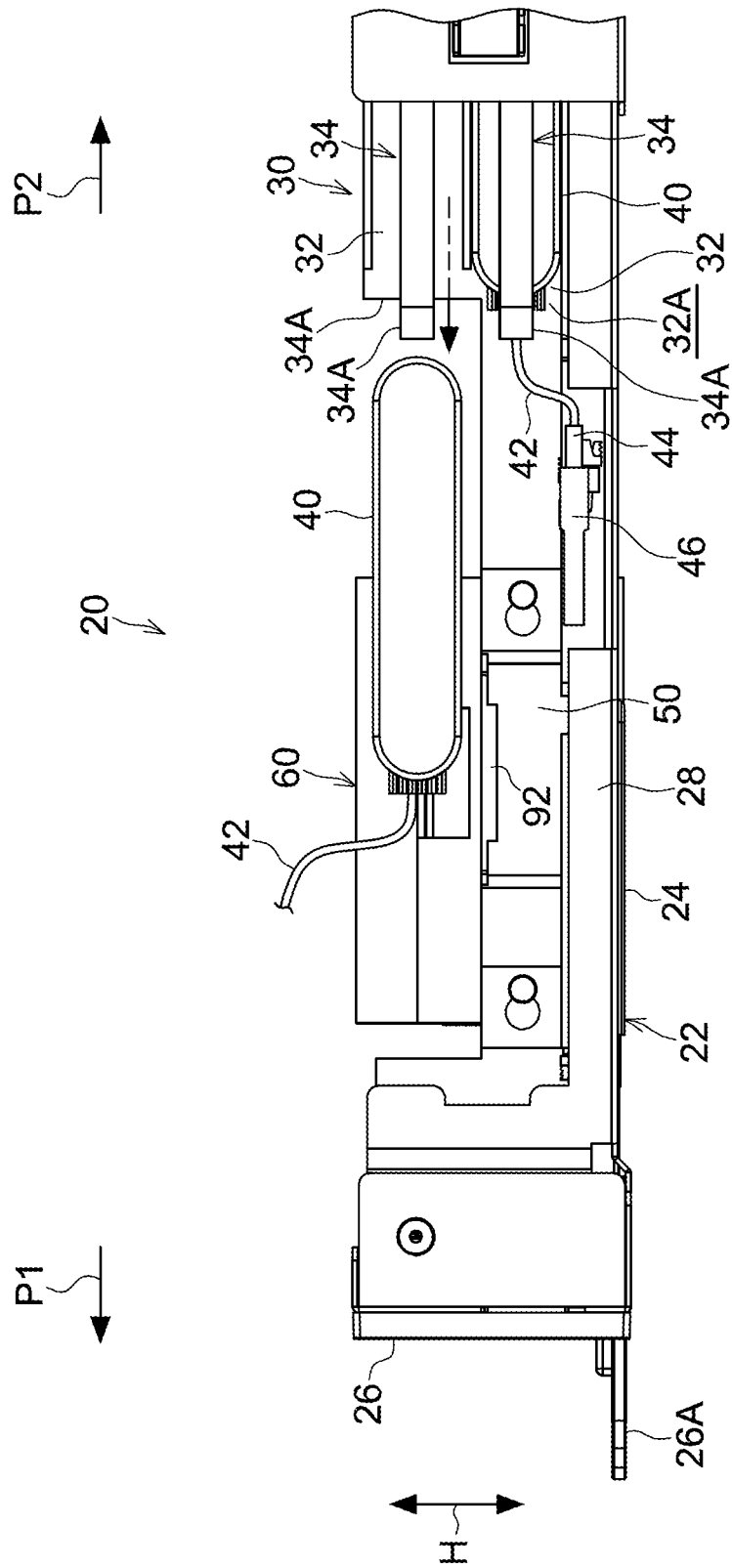
FIG. 3 is a side view illustrating a state in which a first electronic part has been pulled out to a pulling-out space from a first holder illustrated in FIG. 2.

As illustrated in FIG. 3, the first holder 30 is accommodated on the further side of the container 20. In addition, the first holder 30 is formed into a box shape with a close side of the container 20 opened. This first holder 30 accommodates a plurality of (two in the embodiment) first accommodation portions 32.

The plurality of first accommodation portions 32 are arranged so as to be aligned in a height direction (the direction of the arrow H) of the container 20. In addition, each of the first accommodation portions 32 has an accommodation port 32A on the closer side of the container 20. The first electronic part 40 is accommodated in the first accommodation portion 32 from the accommodation port 32A. Note that the first accommodation portion 32 is an example of the first electronic part container.

As illustrated in FIG. 2, a locking arm 34 is provided at the first holder 30. The locking arm 34 is arranged on one side of the first holder 30 in the width direction. The locking arm 34 is arranged in the accommodation direction of the container 20. This locking arm 34 is supported by the first holder 30 in a cantilever state.

A leading end portion of the locking arm 34 is a free end portion. A locking portion 34A is provided at the leading end portion of the locking arm 34. The locking portion 34A is formed into a hook shape. The locking portion 34A is releasably locked by an end portion 40T on the closer side of the first electronic part 40 accommodated in the first accommodation portion 32. In this manner, pulling-out of the first electronic part 40 from the first accommodation portion 32 is restricted. Meanwhile, if the locking arm 34 is elastically deformed toward the outside of the first holder 30, the locking state of the locking portion 34A with respect to the end portion 40T of the first electronic part 40 is released. In this manner, the first electronic part 40 can be pulled out from the first accommodation portion 32.

Note that the locking portion 34A is an example of the first electronic part locking portion. In addition, the locking arm 34 can be appropriately omitted.

(First Electronic Part)

Figure 4:
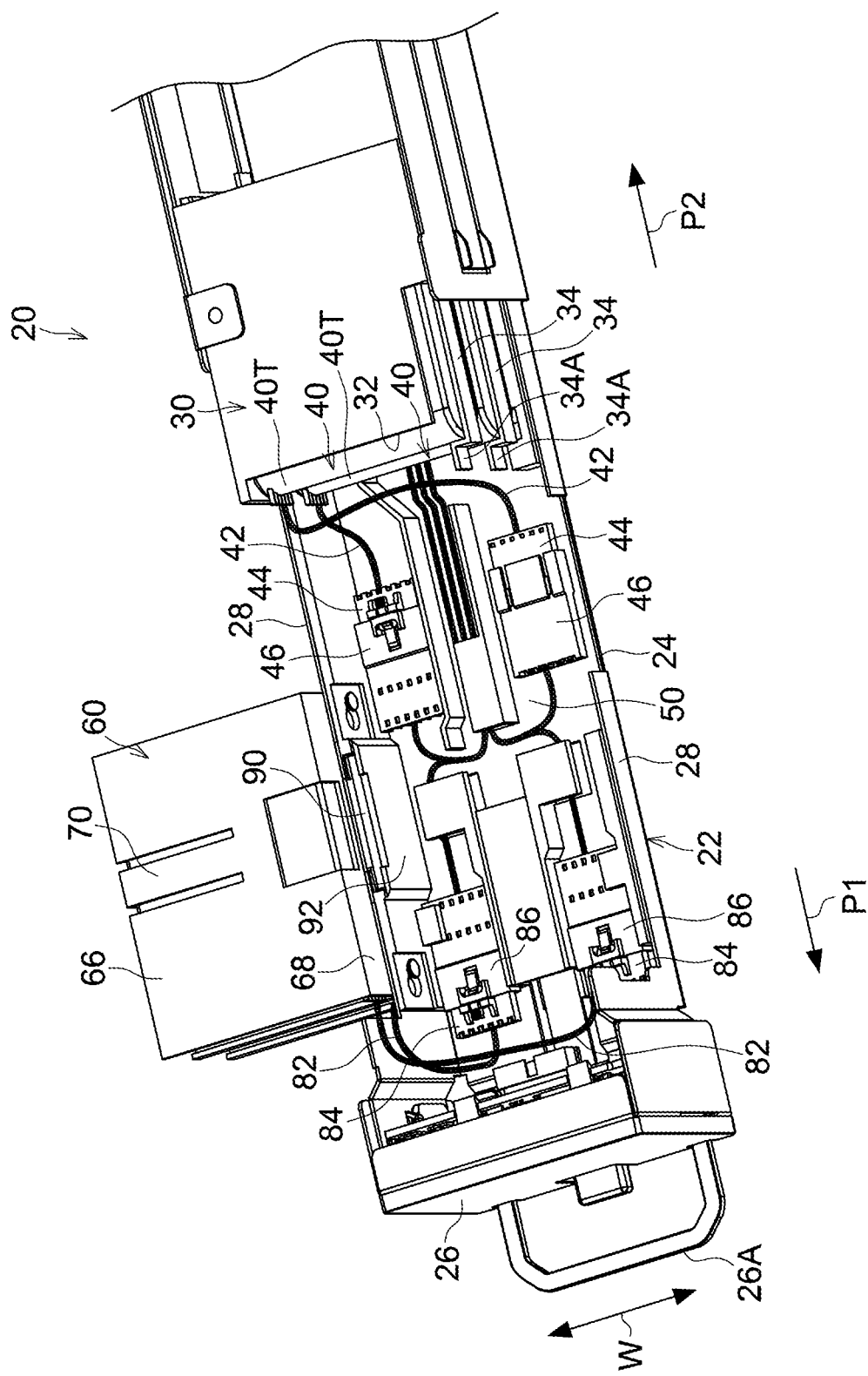
FIG. 4 is a perspective view illustrating a developed state of a second holder illustrated in FIG. 2.

As illustrated in FIG. 4, the first electronic part 40 is a battery, for example. A cable 42 is connected to the first electronic part 40. The cable 42 is made to extend from the end portion 40T of the first electronic part 40 on the closer side. A connector 44 is provided at the leading end portion of the cable 42. Note that the cable 42 is an example of the first electronic part cable.

(Pulling-out Space)

Figure 5:
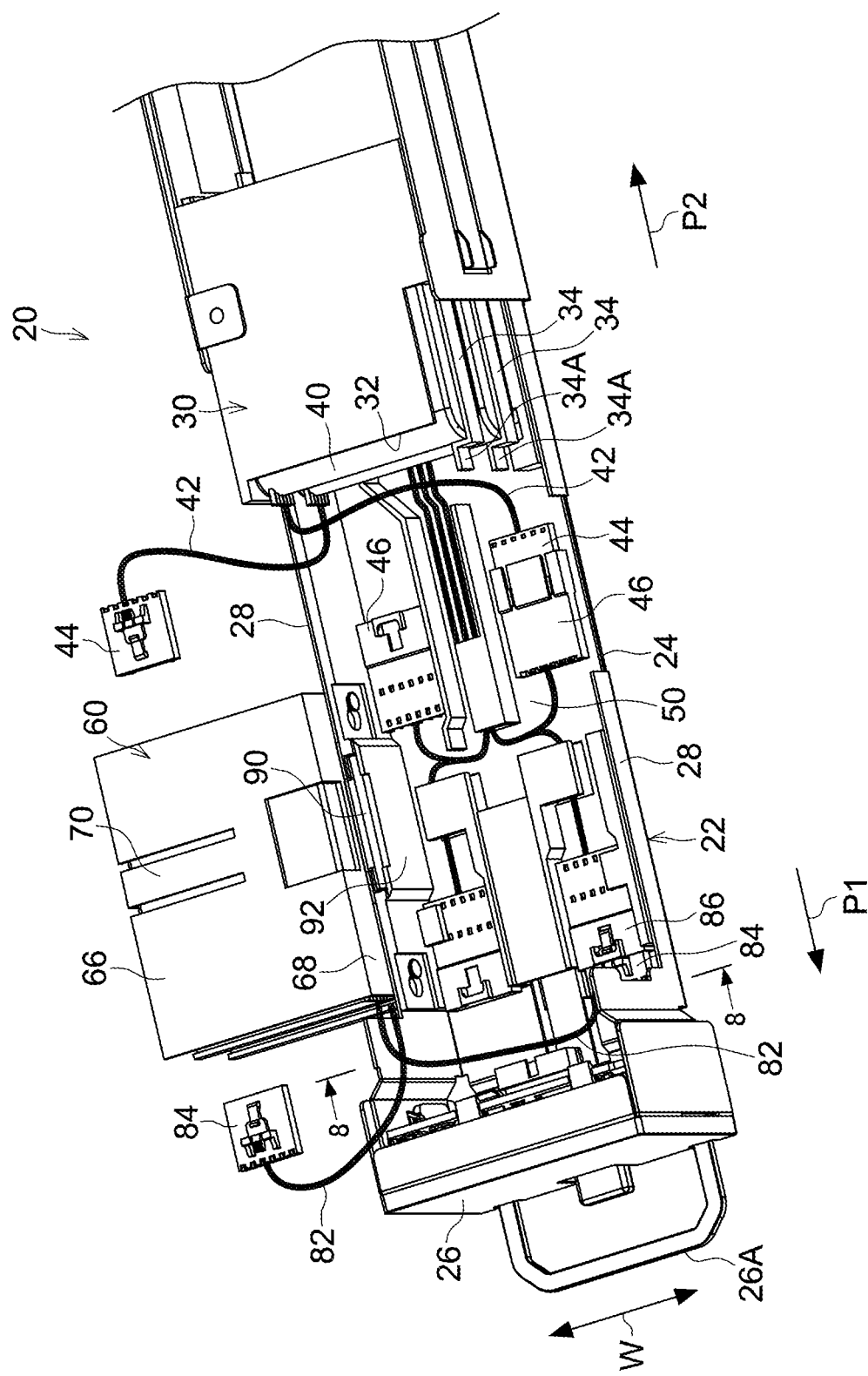
FIG. 5 is a perspective view illustrating a state in which connectors of the first electronic part and a second electronic part illustrated in FIG. 4 have been detached from connectors on the unit side.

As illustrated in FIGS. 4 and 5, a region on the front side of the first holder 30 in the container 20 is a pulling-out space 50. The pulling-out space 50 is a space into which the first electronic part 40 is pulled out from the first accommodation portion 32 of the first holder 30.

A plurality of unit-side connectors 46 are provided at the base panel portion 24 that forms the floor of the pulling-out space 50. Each of the plurality of unit-side connectors 46 is provided so as to correspond to the first electronic part 40. The connector 44 of the cable 42 of the first electronic part 40 is detachably connected to each unit-side connector 46. Note that the unit-side connectors 46 are an example of the first electronic part connector.

(Second Holder)

As illustrated in FIG. 2, a second holder 60 is accommodated in the pulling-out space 50. The second holder 60 is formed into a box shape one side of the container 20 in the width direction and a closer side of the container 20 opened. The second holder 60 is rotatably coupled to the container 20 via a rotation shaft 90, which will be described later. In this manner, the second holder 60 is shifted between an accommodated state (the state illustrated in FIG. 2) in which the second holder 60 is accommodated in the pulling-out space 50 and a developed state (the state illustrated in FIG. 4) in which the second holder 60 is outside the pulling-out space 50 in accordance with the rotation about the rotation shaft 90.

Note that the upper side, the lower side, the left side, and the right side of the second holder 60 in the following description mean the upper side, the lower side, the left side, and the right side in a state in which the second holder 60 is accommodated in the pulling-out space 50 unless otherwise particularly stated.

Figure 6:
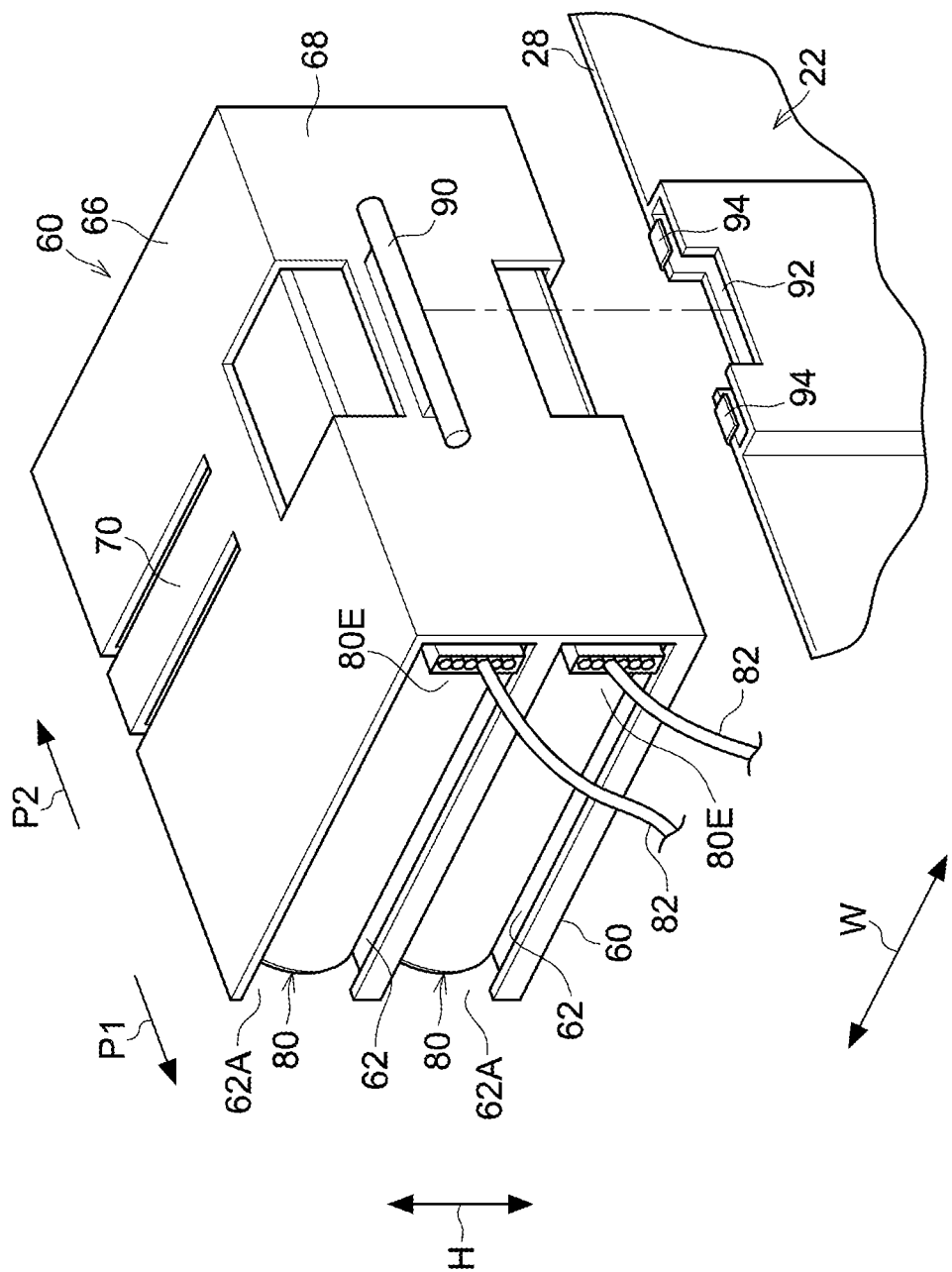
FIG. 6 is an exploded perspective view in which the second holder illustrated in FIG. 4 and a frame are exploded.

As illustrated in FIG. 6, the second holder 60 has a plurality of (two in the embodiment) second accommodation portions 62. The plurality of second accommodation portions 62 are arranged so as to be aligned in the height direction of the container 20. In addition, each of the second accommodation portions 62 has an accommodation port 62A on the other side (the left side in FIG. 6) of the container 20 in the width direction. In other words, each second accommodation portion 62 has an accommodation port 62A on the outer side in the radial direction of the rotation shaft 90. The second electronic part 80 is accommodated in the second accommodation portion 62 via the accommodation port 62A.

The second holder 60 has a pair of facing wall portions 66 and a side wall portion 68. The pair of facing wall portions 66 are arranged so as to face one another in the height direction of the container 20. In addition, the pair of facing wall portions 66 are connected via the side wall portion 68. The side wall portion 68 connects end portions of the pair of facing wall portions 66 on one side in the width direction (the right side in FIG. 6).

Figure 7:
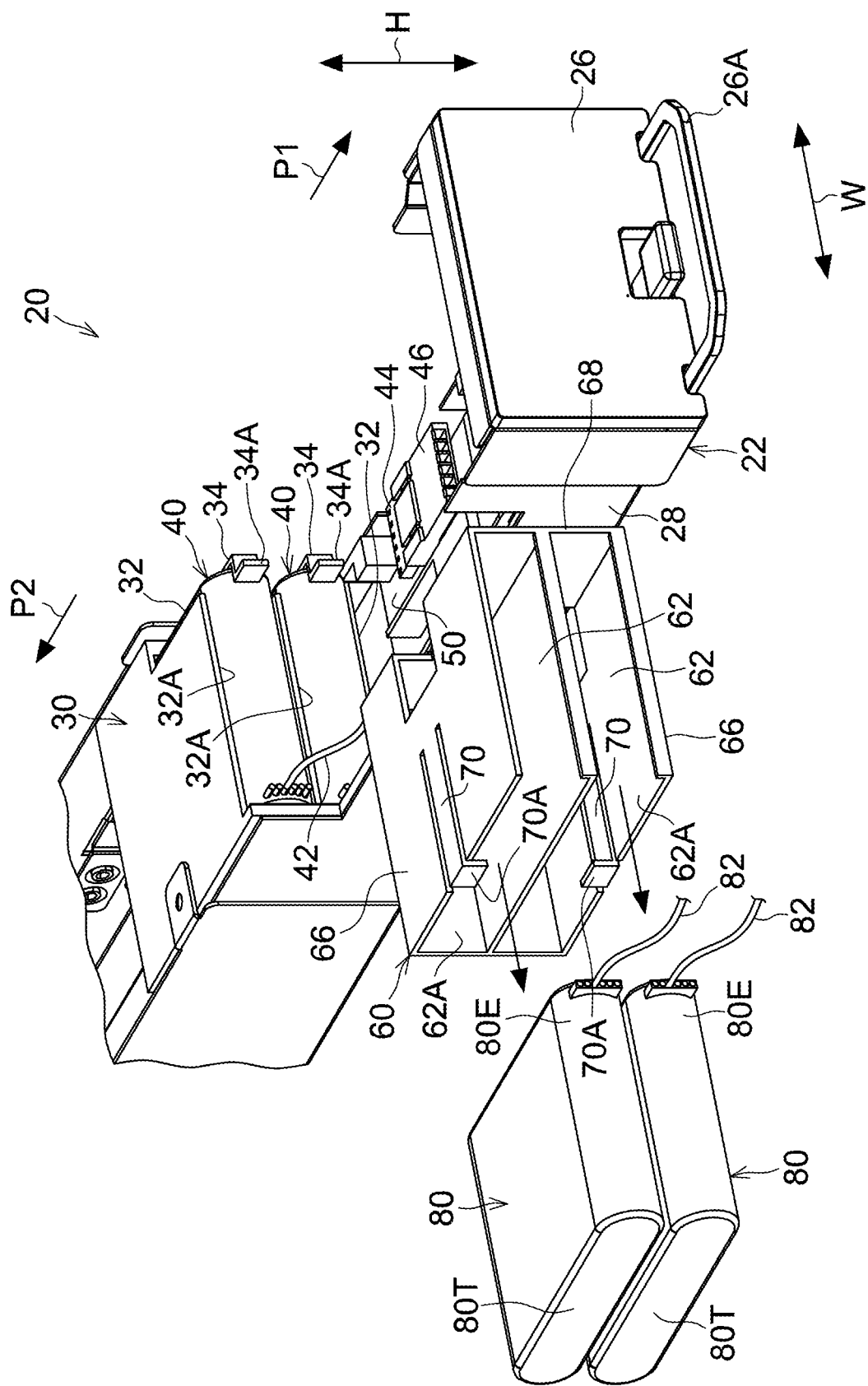
FIG. 7 is a perspective view illustrating a state in which the second electronic part has been pulled out from the second holder in the developed state illustrated in FIG. 5.

As illustrated in FIG. 7, a locking arm 70 is provided at the second holder 60. The locking arm 70 is provided at each of the pair of facing wall portions 66 of the second holder 60. The locking arm 70 is arranged in the width direction of the container 20. In addition, a pair of slits are formed on both sides of the locking arm 70. The locking arm 70 is supported by the second holder 60 in a cantilever manner.

A leading end portion of the locking arm 70 is a free end portion. A locking portion 70A is provided at the leading end portion of the locking arm 70. The locking portion 70A is formed in a hook shape. The locking portion 70A is releasably locked by an end portion 80T of the second electronic part 80 accommodated in the second accommodation portion 62. In this manner, pulling-out of the second electronic part 80 from the second accommodation portion 62 is restricted. In addition, if the locking arm 70 is elastically deformed to the outside of the first holder 30, the locking state of the locking portion 70A with respect to the end portion 80T of the second electronic part 80 is released. In this manner, the second electronic part 80 can be pulled out from the second accommodation portion 62.

Note that the locking portion 70A is an example of the second electronic part locking portion. In addition, the locking arm 70 can be appropriately omitted.

(Second Electronic Part)

As illustrated in FIG. 6, the second electronic part 80 is a battery, for example. A cable 82 is connected to the second electronic part 80. The cable 82 is connected to an end portion 80E on the side of the rotation shaft 90 of the second electronic part 80 on the closer side. As illustrated in FIGS. 4 and 5, a connector 84 is provided at a leading end portion of the cable 82 of the second electronic part 80. Note that the cable 82 is an example of the second electronic part cable.

A plurality of unit-side connectors 86 are provided at the base panel portion 24 that forms the floor of the pulling-out space 50. Each of the plurality of unit-side connector 86 is provided so as to correspond to the second electronic part 80. A connector 84 of the cable 82 of the second electronic part 80 is detachably connected to each unit-side connector 86.

(Rotation Shaft)

Here, the rotation shaft 90 of the second holder 60 will be described. As illustrated in FIG. 6, the rotation shaft 90 is provided on the outer surface of the side wall portion 68 of the second holder 60. The rotation shaft 90 is arranged in the accommodation direction of the container 20. Meanwhile, a bearing portion 92 is provided at the side panel portion 28 of the container 20 on the other side in the width direction. The bearing portion 92 is formed into a groove shape extending in the accommodation direction of the container 20. The rotation shaft 90 is rotatably supported by the bearing portion 92.

Note that stopper portions 94 that suppress slipping the rotation shaft 90 are respectively provided at end portions of the bearing portion 92 in the longitudinal direction. In addition, the side panel portion 28 is an example of one end portion of the container in the width direction.

(Method of Replacing First Electronic Part and Second Electronic Part)

Next, a method of replacing the first electronic part 40 and the second electronic part 80 accommodated in the container 20 will be described. Note that the first electronic part 40 and the second electronic part 80 are replaced in a state in which the information processing apparatus 10 is activated, that is, in a state in which the information processing apparatus 10 is energized in the embodiment.

(Method of Replacing Second Electronic Part)

First, a method of replacing the second electronic part 80 will be described. First, an operator pulls out the container 20 accommodated in the case body 12 of the information processing apparatus 10 toward the closer side (toward the side of the arrow P1) as illustrated in FIG. 2. In this manner, the second holder 60 accommodated in the pulling-out space 50 of the container 20 is exposed.

Figure 8:
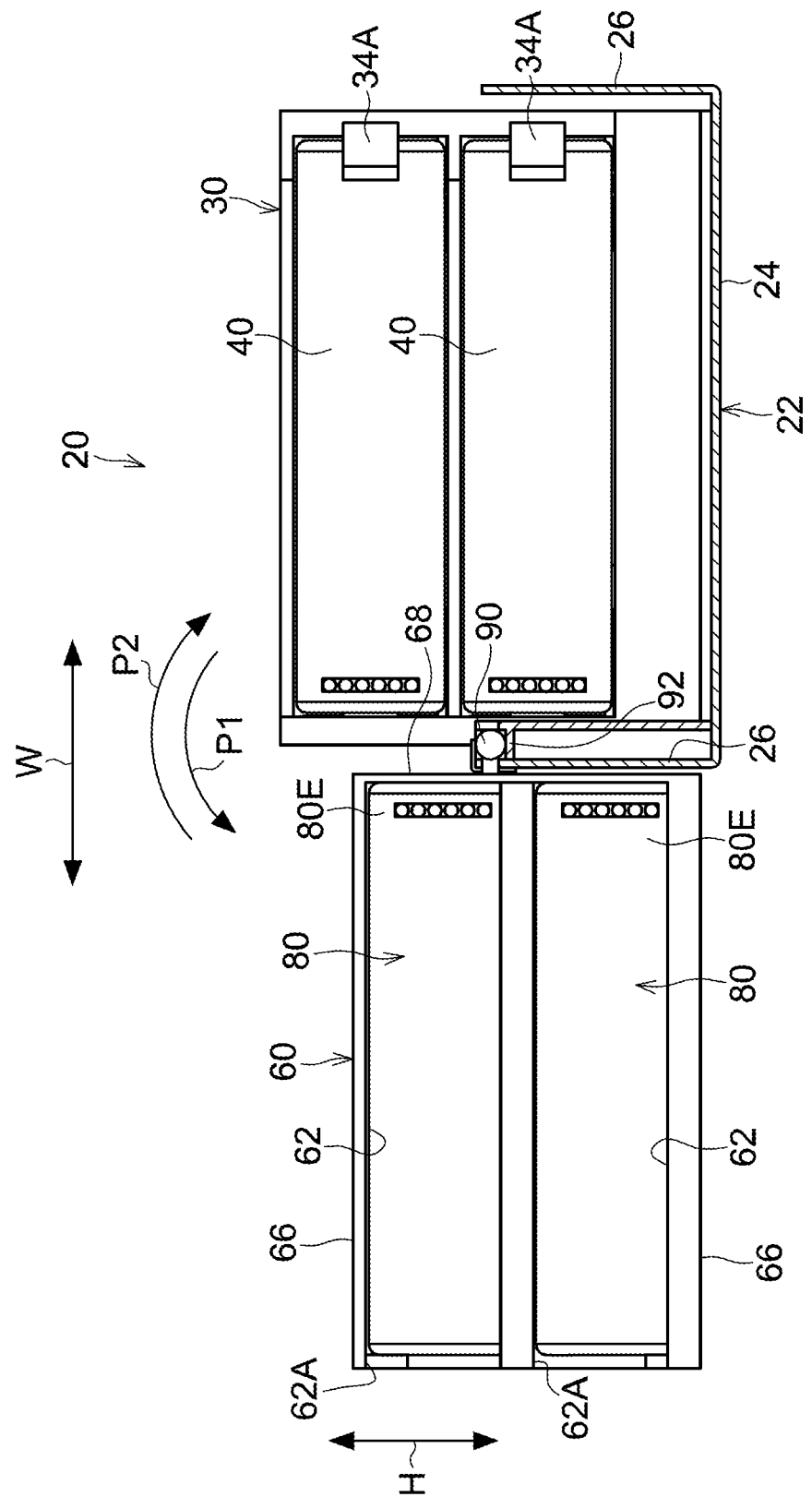
FIG. 8 is a sectional view taken along the line 8-8 in FIG. 5, which schematically illustrates the developed state of the second holder.

Next, the operator rotates the second holder 60 accommodated in the pulling-out space 50 about the rotation shaft 90 toward the other side (the side of the arrow R1) of the container 20 in the width direction with respect to the frame 22 as illustrated in FIG. 8. In this manner, the second holder 60 is shifted from the accommodated state in which the second holder 60 is accommodated in the pulling-out space 50 to the developed state in which the second holder 60 is outside the pulling-out space 50. As a result, the connector 84 of the second electronic part 80 arranged below the second holder 60 and the unit-side connector 86 are exposed as illustrated in FIG. 4.

Note that the second holder 60 is arranged outside the container 20 in the developed state. In addition, the upper side and the lower side of the second holder 60 are inverted, and also, the accommodation ports 62A of the plurality of second accommodation portions 62 are made to face the other side of the container 20 in the width direction in the developed state.

Next, the operator detaches the connector 84 of the second electronic part 80 from the unit-side connector 86 as illustrated in FIG. 5. In addition, the operator releases the locking state of the locking portion 70A of the locking arm 70 with respect to the end portion 80T of the second electronic part 80. In this state, the operator pulls out the second electronic part 80 form the second accommodation portion 62 of the second holder 60 on the other side of the container 20 in the width direction as illustrated in FIG. 7. In other words, the operator pulls out the second electronic part 80 from the second accommodation portion 62 of the second holder 60 toward the outer side in the radial direction of the rotation shaft 90. In this manner, the second electronic part 80 is detached from the second accommodation portion 62.

Next, the operator accommodates the second electronic part for replacement, which is not illustrated in the drawing, in the second accommodation portion 62 of the second holder 60 and also causes the end portion of the second electronic part to lock the locking portion 70A of the locking arm 70. In this manner, the second electronic part for replacement, which is not illustrated in the drawing, is retained in the second accommodation portion 62 by the locking arm 70.

Next, the operator connects the connector 84 of the second electronic part 80 to the unit-side connector 86. In this manner, the second electronic part for replacement, which is not illustrated in the drawing, is electrically connected to the information processing apparatus 10.

Next, the operator rotates the second holder 60 arranged outside the container 20 about the rotation shaft 90 toward one side of the container 20 in the width direction (the side of the arrow R2) with respect to the frame 22 as illustrated in FIG. 8. In this manner, the second holder 60 is shifted from the developed state to the accommodated state in which the second holder 60 is accommodated in the pulling-out space 50 in the container 20 as illustrated in FIG. 2.

Next, the operator accommodates the container 20 in the case body 12 as illustrated in FIG. 1. In this manner, the second electronic part 80 is replaced.

(Method of Replacing First Electronic Part)

Next, a method of replacing the first electronic part 40 will be described. First, the operator pulls out the container 20 accommodated in the case body 12 of the information processing apparatus 10 toward the closer side (the side of the arrow P1) as illustrated in FIG. 2. In this manner, the second holder 60 and the first holder 30 accommodated in the pulling-out space 50 of the container 20 are exposed.

Next, the operator rotates the second holder 60 accommodated in the pulling-out space 50 and shifts the second holder 60 from the accommodated state to the developed state as illustrated in FIG. 8. As a result, the plurality of unit-side connectors 46 for the first electronic parts 40 arranged below the second holder 60 are exposed to the pulling-out space 50 as illustrated in FIG. 4.

Next, the operator detaches the connector 44 of the first electronic part 40 from the unit-side connector 46 as illustrated in FIG. 5. In addition, the operator releases the locking state of the locking portion 34A of the locking arm 34 with respect to the end portion 40T of the first electronic part 40. In this state, the operator pulls out the first electronic part 40 from the first accommodation portion 32 of the first holder 30 to the pulling-out space 50 as illustrated in FIG. 3. In this manner, the first electronic part 40 is detached from the first accommodation portion 32.

Next, the operator accommodates a first electronic part for replacement, which is not illustrated in the drawing, in the first accommodation portion 32 of the first holder 30 and causes the end portion of the first electronic part to lock the locking portion 34A of the locking arm 34. In this manner, the first electronic part for replacement, which is not illustrated in the drawing, is retained by the first accommodation portion 32 by the locking arm 34.

Next, the operator connects the connector 44 of the first electronic part 40 to the unit-side connector 46. In this manner, the first electronic part for replacement, which is not illustrated in the drawing, is electrically connected to the information processing apparatus 10.

Next, the operator rotates the second holder 60 arranged outside the container 20 about the rotation shaft 90 toward one side of the container 20 in the width direction (the side of the arrow R2) with respect to the frame 22 as illustrated in FIG. 8. In this manner, the second holder 60 is shifted from the developed state in which the second holder 60 is arranged outside the container 20 to the accommodated state in which the second holder 60 is accommodated in the pulling-out space 50 in the container 20 as illustrated in FIG. 2.

Next, the operator accommodates the container 20 in the case body 12 as illustrated in FIG. 1. In this manner, the first electronic part 40 is replaced.

(Effects and Advantages)

Next, effects and advantages of the embodiment will be described.

According to the information processing apparatus 10 of the embodiment, the container 20 is accommodated in the case body 12. The container 20 has the first holder 30 and the pulling-out space 50. The first electronic part 40 is accommodated in the first holder 30. In addition, the first electronic part 40 accommodated in the first holder 30 is pulled out from the first holder 30 into the pulling-out space 50 in the container 20.

Here, it is preferable to secure the pulling-out space for the first electronic part 40 outside the container 20 in a case in which the first electronic part 40 is pulled out to the outside of the container 20 in a comparative example, for example. In this case, there is a possibility that an installation location (pulling-out location) of the container 20 is restricted.

In contrast, the first electronic part 40 is pulled out from the first holder 30 into the pulling-out space 50 in the container 20 as described above in the embodiment. This makes it possible not to secure the pulling-out space for the first electronic part 40 outside the container 20. Therefore, it is possible to enhance a degree of freedom for the installation location of the container 20 in the embodiment as compared with a case in which the first electronic part 40 is pulled out to the outside of the container 20.

Meanwhile, there is a possibility that if the pulling-out space 50 is provided in the container 20, the size of the container 20 increases. In contrast, the second holder 60 is accommodated in the pulling-out space 50 according to the embodiment. The second electronic part 80 is accommodated in the second holder 60. In this manner, it is possible to reduce the size of the container 20 in the embodiment as compared with the case in which the accommodation space for the second electronic part 80 is secured in the container 20 separately from the pulling-out space 50.

In addition, the second holder 60 is coupled to the container 20 via the rotation shaft 90. The second holder 60 is shifted between the accommodated state in which the second holder 60 is accommodated in the pulling-out space 50 and the developed state in which the second holder 60 is outside the pulling-out space 50 in accordance with the rotation about the rotation shaft 90. Then, if the second holder 60 is shifted from the accommodated state to the developed state, it becomes possible to pull out the first electronic part 40 from the first holder 30 into the pulling-out space 50.

According to the embodiment, it is possible to secure the pulling-out space 50 for the first electronic part 40 in the container 20 and to reduce the size of the container 20 as described above.

Furthermore, the rotation shaft 90 is arranged in the accommodation direction of the container 20. In this manner, the width of the container 20 can be narrowed in the embodiment as compared with a case in which the rotation shaft 90 is arranged in the width direction of the container 20.

In addition, the first holder 30 and the pulling-out space 50 are arranged so as to be aligned in the accommodation direction of the container 20 with respect to the case body 12. In this manner, the width of the container 20 can be narrowed in the embodiment as compared with a case in which the first holder 30 and the pulling-out space 50 are arranged so as to be aligned in the width direction of the container 20.

Further, the pulling-out space 50 is arranged on the closer side of the accommodation direction of the container 20 with respect to the first holder 30. In this manner, it is possible to pull out the first electronic part 40 from the first holder 30 into the pulling-out space 50 even in a state in which the entire first holder 30 is not pulled out from the case body 12. Therefore, it is possible to reduce the amount of the pulling-out of the container 20 from the case body 12 when the first electronic part 40 is replaced. Therefore, it is possible to improve the degree of freedom for the installation location of the container 20.

In addition, the second electronic part 80 is pulled out from the second holder 60 to the outside in the radial direction of the rotation shaft 90. That is, the pulling-out direction of the second electronic part 80 can be adjusted in accordance with a rotation angle of the second holder 60. Therefore, it is possible to further improve the degree of freedom for the installation location of the container 20.

In addition, the unit-side connectors 46 and 86 to which the connectors 44 and 84 of the first electronic part 40 and the second electronic part 80 are connected are provided in the pulling-out space 50 in the container 20. Then, if the second holder 60 is shifted from the accommodated state to the developed state, the connectors 44 and 84 of the first electronic part 40 and the second electronic part 80 and the unit-side connectors 46 and 86 are exposed to the pulling-out space 50. That is, an attaching and detaching operation space for the connectors 44 and 84 of the first electronic part 40 and the second electronic part 80 is secured in the pulling-out space 50 in the container 20 in the embodiment.

Here, it is considered that the connectors of the electronic parts and the unit-side connectors are pulled out to the outside of the container along with the electronic parts when the electronic parts are replaced, and the connectors of the electronic parts and the unit-side connectors are attached and detached to and from each other outside the container, for example, in a comparative example. However, there is a possibility that the cables of the electronic parts and the cables of the unit-side connectors become long in this case. As a result, there is a possibility that the accommodation spaces for the cables increases and the size of the container increases.

Meanwhile, the connectors 44 and 84 of the first electronic part 40 and the second electronic part 80 and the unit-side connectors 46 and 86 are provided in the pulling-out space 50 in the container 20 in the embodiment as described above. In this manner, it is possible to shorten the cables 42 and 82 for the first electronic part 40 and the second electronic part 80 and the cables for the unit-side connectors 46 and 86 in the embodiment as compared with the aforementioned comparative example. Therefore, it is possible to narrow the accommodation spaces for the cables 42 and 82. Therefore, it is possible to reduce the size of the container 20.

In addition, since the second electronic part 80 rotates about the rotation shaft 90 along with the second holder 60, it is preferable that the cable 82 for the second electronic part 80 have an extra length. The extra length of the cable 82 becomes longer as a connection position between the second electronic part 80 and the cable 82 is further separated from the rotation shaft 90.

Meanwhile, the cable 82 extends from the end portion 80E of the second electronic part 80 on the side of the rotation shaft 90 in the embodiment. In this manner, it is possible to shorten the extra length of the cable 82 in the embodiment as compared with a case in which the cable 82 extends from the end portion of the second electronic part 80 on the opposite side of the rotation shaft 90. Therefore, it is possible to further narrow the accommodation space for the cable 82 of the second electronic part 80.

(Modification Example)

Next, a modification example of the aforementioned embodiment will be described.

Figure 9:
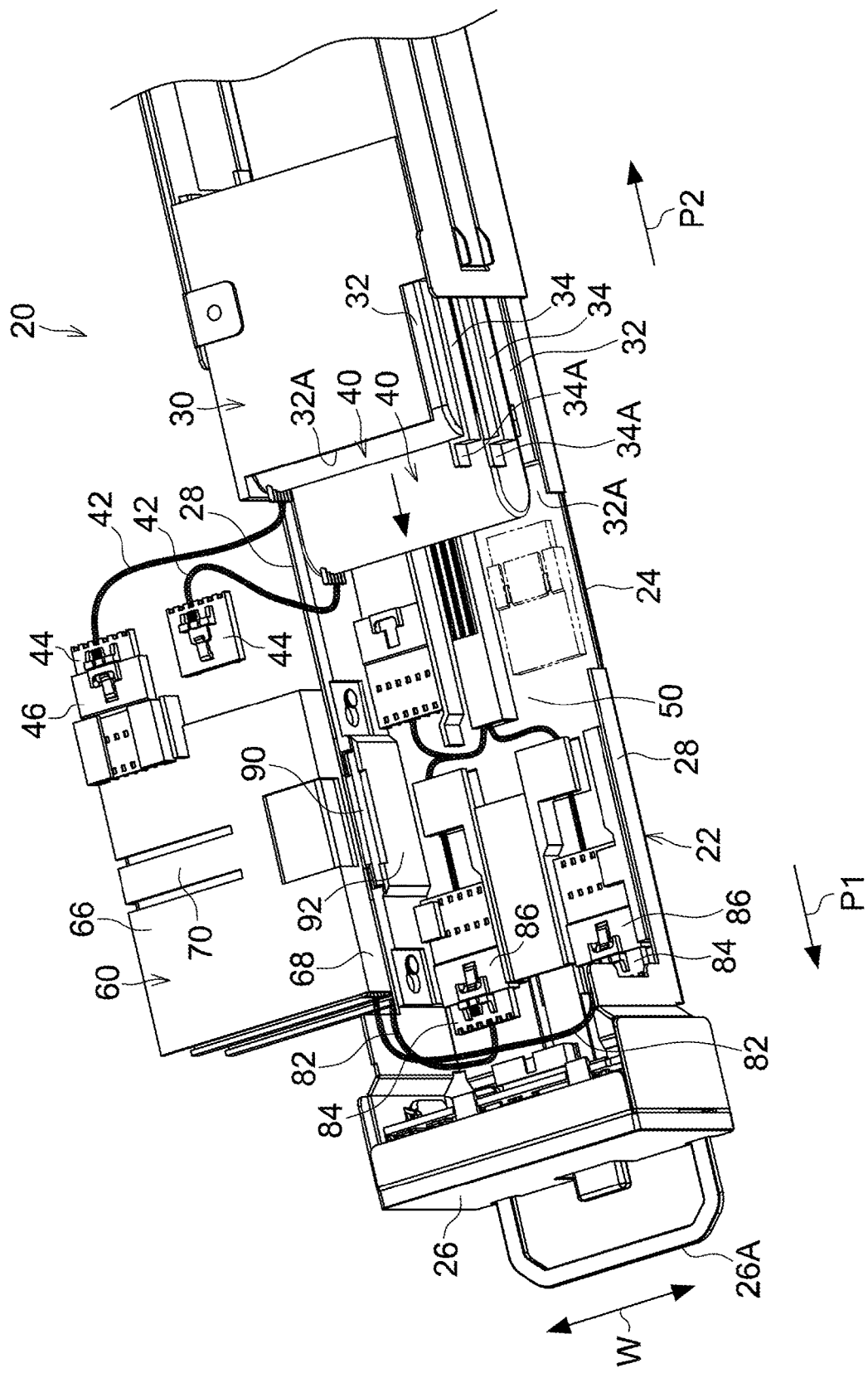
FIG. 9 is a perspective view corresponding to FIG. 5, which illustrates a modification example of the container according to the embodiment.

In the aforementioned embodiment, the unit-side connector 46 of the first electronic part 40 is provided in the pulling-out space 50. However, the unit-side connector 46 of the first electronic part 40 may be provided in the second holder 60 as illustrated in FIG. 9, for example.

Specifically, the unit-side connector 46 is provided on the outer surface of a facing wall portion 66 on the lower side (on the side of the base panel portion 24) in the pair of facing wall portions 66 of the second holder 60. The connector 84 of the second electronic part 80 that is accommodated in the second accommodation portion 62 on the upper portion of the first holder 30 in the two second electronic parts 80 accommodated in the first holder 30 is connected to the unit-side connector 46.

In this manner, the cable 42 for the first electronic part 40 accommodated in the second accommodation portion 62 at the upper portion of the first holder 30 is arranged along with the second holder 60 at a position outside the pulling-out space 50 when the second holder 60 is shifted from the accommodated state to the developed state. As a result, it becomes easier to pull out the first electronic part 40 accommodated in the second accommodation portion 62 at the lower portion of the first holder 30 into the pulling-out space 50. Therefore, it becomes easier to replace the first electronic part 40 accommodated in the second accommodation portion 62 at the upper portion of the first holder 30.

Next, the two first accommodation portions 32 of the first holder 30 are arranged so as to be aligned in the height direction of the container 20 in the aforementioned embodiment. However, a plurality of first electronic part accommodation portions aligned in the width direction of the container 20 may be provided in the first holder 30, for example. In addition, it is possible to situate at least one first electronic part container in the first holder 30.

In a similar manner to this, the two second accommodation portions 62 of the second holder 60 are arranged so as to be aligned in the height direction of the container 20 in the accommodated state in the aforementioned embodiment. However, a plurality of second electronic part accommodation portions aligned in the width direction of the container 20 may be provided in the second holder 60 in the accommodated state, for example. In addition, at least one second electronic part accommodation portion can be provided in the second holder 60.

In addition, the connectors 44 and 84 for the first electronic part 40 and the second electronic part 80 and the unit-side connectors 46 and 86 are provided in the pulling-out space 50 in the aforementioned embodiment. However, the connectors 44 and 84 for the first electronic part 40 and the second electronic part 80 and the unit-side connectors 46 and 86 may be provided in a space other than the pulling-out space 50 in the container 20.

In addition, the rotation shaft 90 of the second holder 60 is arranged in the accommodation direction of the container 20 in the aforementioned embodiment. However, the rotation shaft of the second holder 60 may be arranged in the width direction of the container 20, for example.

In addition, the first holder 30 and the pulling-out space 50 are arranged so as to be aligned in the accommodation direction of the container 20 in the aforementioned embodiment. However, the first holder 30 and the pulling-out space 50 may be arranged so as to be aligned in the width direction of the container 20, for example.

Further, the first electronic part 40 is a battery in the aforementioned embodiment. However, the first electronic part 40 may be a storage device (including an HDD and an SSD), a cooling fan, or an extension card, for example. In a similar manner to this, the second electronic part 80 is not limited to a battery and may be a storage device (including an HDD and an SSD), a cooling fan, or an extension card, for example.

In addition, the first electronic part 40 and the second electronic part 80 are replaced in a state in which the information processing apparatus 10 is activated in the aforementioned embodiment. However, the first electronic part 40 and the second electronic part 80 may be replaced in a state in which the information processing apparatus 10 is not activated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing apparatus comprising:
a case body;
a container accommodated so as to be able to be drawn out from the case body, the container being configured to form a first space and a second space in the container, the second space being placed adjacent in a first direction from the first space;
a first holder accommodated in the first space of the container, the first holder being configured to accommodate a first electronic part; and
a second holder accommodated in the second space of the container, the second holder being coupled to the container via a rotation shaft, and
when the container is drawn out from the case body, the second holder is able to be turned over with the rotation shaft and taken outside the second space of the container, and
the first holder is configured so that the first electronic part in the first holder is able to be drawn from the first holder to the first direction when the second holder is taken outside the second space of the container.

2. The information processing apparatus according to claim 1, further comprising:
a pulling-out space into which the first electronic part is pulled out from the first holder; and
a second electronic part connector, which is included in the pulling-out space, to which a second electronic part cable extending from the second electronic part is connected.

3. The information processing apparatus according to claim 2, wherein the second holder is arranged on the second electronic part connector in an accommodated state in which the second holder is accommodated in the pulling-out space.

4. The information processing apparatus according to claim 2, wherein the second electronic part cable extends from an end portion of the second electronic part on a side of the rotation shaft.

5. The information processing apparatus according to claim 2, further comprising:
a first electronic part connector, which is included in the pulling-out space, and to which a first electronic part cable extending from the first electronic part is connected.

6. The information processing apparatus according to claim 3, wherein the second holder is arranged on the first electronic part connector in the accommodated state.

7. The information processing apparatus according to claim 1, further comprising:
a first electronic part connector, which is included in the second holder, and to which a first electronic part cable extending from the first electronic part is connected.

8. The information processing apparatus according to claim 2, wherein the first holder and the pulling-out space are aligned in an accommodation direction of the container with respect to the case body.

9. The information processing apparatus according to claim 8,
wherein the container is able to be pulled out from the case body, and
wherein the pulling-out space is arranged on a closer side in the accommodation direction of the container with respect to the first holder.

10. The information processing apparatus according to claim 1, wherein the second electronic part is pulled out to an outer side in a radial direction of the rotation shaft from the second holder.

11. The information processing apparatus according to claim 8, wherein the rotation shaft is arranged in the accommodation direction of the container.

12. The information processing apparatus according to claim 1, wherein the rotation shaft is arranged along one end portion in a width direction of the container.

13. The information processing apparatus according to claim 1, wherein the second holder has a plurality of second electronic part containers that accommodate a plurality of second electronic parts.

14. The information processing apparatus according to claim 13, wherein the plurality of second electronic part containers are aligned in a height direction of the container in an accommodated state of the second holder.

15. The information processing apparatus according to claim 1, wherein the first holder has a plurality of first electronic part containers that accommodate a plurality of first electronic parts.

16. The information processing apparatus according to claim 15, wherein the plurality of first electronic part containers are aligned in a height direction of the container.

17. The information processing apparatus according to claim 1, further comprising:
a first electronic part locking portion that is included in the first holder, that is releasably locked by the first electronic part, and that restricts pulling-out of the first electronic part from the first holder.

18. The information processing apparatus according to claim 1, further comprising:
a second electronic part locking portion that is included in the second holder, that is releasably locked by the second electronic part, and that restricts pulling-out of the second electronic part from the second holder.

19. The information processing apparatus according to claim 1,
wherein the first electronic part includes at least one of a battery, a storage device, a cooling fan, and an extension card, and
wherein the second electronic part includes at least one of a battery, a storage device, a cooling fan, and an extension card.

* * * * *